(12) United States Patent
Cai et al.

(10) Patent No.: US 10,903,217 B2
(45) Date of Patent: Jan. 26, 2021

(54) ANTI-FUSE MEMORY CELL AND A METHOD FOR FORMING THE ANTI-FUSE MEMORY CELL

(71) Applicant: GLOBALFOUNDRIES Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1 day.

(21) Appl. No.: 16/251,129

(22) Filed: Jan. 18, 2019

(65) Prior Publication Data
US 2020/0235106 A1   Jul. 23, 2020

(51) Int. Cl.
*H01L 27/112* (2006.01)
*G11C 17/16* (2006.01)
*H01L 27/115* (2017.01)

(52) U.S. Cl.
CPC ........ *H01L 27/11206* (2013.01); *G11C 17/16* (2013.01); *H01L 27/115* (2013.01)

(58) Field of Classification Search
CPC .. H01L 27/11206; H01L 27/115; G11C 17/16
See application file for complete search history.

(56) References Cited

U.S. PATENT DOCUMENTS

| 5,607,871 | A  | * | 3/1997  | Han ................. H01L 27/11521 438/264 |
| 9,443,860 | B1 | * | 9/2016  | Sung ................. H01L 27/11206 |
| 9,589,970 | B1 | * | 3/2017  | Tseng ................. H01L 29/0653 |
| 2007/0257331 | A1 |   | 11/2007 | Kurjanowicz et al. |
| 2008/0112231 | A1 | * | 5/2008  | Shum ................. G11C 16/3418 365/185.27 |
| 2008/0246098 | A1 |   | 10/2008 | Kurjanowicz |

(Continued)

OTHER PUBLICATIONS

Yuh-Te Sung, et al., "A New Saw-Like Self-Recovery of Interface States in Nitride-Based Memory Cell", IEDM14, 2014, pp. 19.5.1-19.5.4, IEEE.

(Continued)

*Primary Examiner* — Nathan W Ha
(74) *Attorney, Agent, or Firm* — Viering Jentschura & Partner MBB

(57) ABSTRACT

An anti-fuse memory cell may include a substrate including first and second conductivity regions and an isolation region at least partially within the substrate, a program gate over the substrate, a program gate oxide layer over the isolation region and between the program gate and the substrate, a first channel region arranged laterally between the first conductivity region and the isolation region, a second channel region arranged laterally between the second conductivity region and the isolation region, a first select gate arranged over the substrate and over the first channel region and a second select gate arranged over the substrate and over the second channel region. The program gate oxide layer may be configured to break down to allow conduction between the program gate and at least one of the channel regions upon providing a program voltage difference between the program gate and at least one of the channel regions.

20 Claims, 7 Drawing Sheets

(56) References Cited

U.S. PATENT DOCUMENTS

| | | | |
|---|---|---|---|
| 2009/0166708 A1* | 7/2009 | Io | H01L 27/11524 |
| | | | 257/319 |
| 2013/0020626 A1* | 1/2013 | Tan | H01L 29/42344 |
| | | | 257/316 |
| 2014/0054712 A1* | 2/2014 | Jung | H01L 27/108 |
| | | | 257/368 |
| 2014/0126299 A1* | 5/2014 | Fukumoto | H01L 29/66825 |
| | | | 365/185.33 |
| 2014/0183689 A1* | 7/2014 | Sung | H01L 23/5252 |
| | | | 257/530 |
| 2015/0333072 A1* | 11/2015 | Li | H01L 29/40117 |
| | | | 365/182 |
| 2016/0300843 A1* | 10/2016 | Jung | H01L 27/11206 |
| 2016/0351451 A1 | 12/2016 | Wang et al. | |
| 2017/0125425 A1* | 5/2017 | Chen | G11C 16/0433 |
| 2017/0345840 A1* | 11/2017 | Su | H01L 21/30625 |
| 2020/0212054 A1* | 7/2020 | Lee | H01L 27/11206 |

OTHER PUBLICATIONS

Lee Cleveland, "The Future of Embedded Flash", GSA Forum, https://www.gsaglobal.org/forum/2010/1/articles_kilopass.asp, downloaded on Jan. 11, 2019, 3 pages.

Paul Mclellan, "New Sensing Scheme for OTP Memories", SemiWiki.com, http://www.semiwiki.com/forum/content/5014-new-sensing-scheme-otp-memories.html, published on Sep. 22, 2015, 2 pages.

Linh Hong, "Building a Successful Non Volatile Memory (NVM) Company on the basis of CMOS Oxide Breakdown", EDACafe, https://www10.edacafe.com/blogs/ipshowcase/?p=112#more-112, 2012, 7 pages.

* cited by examiner

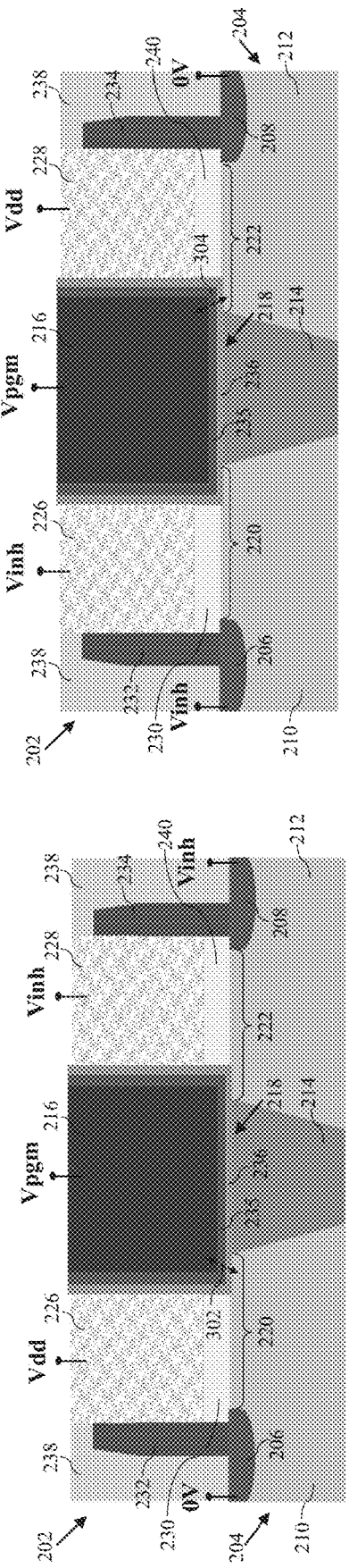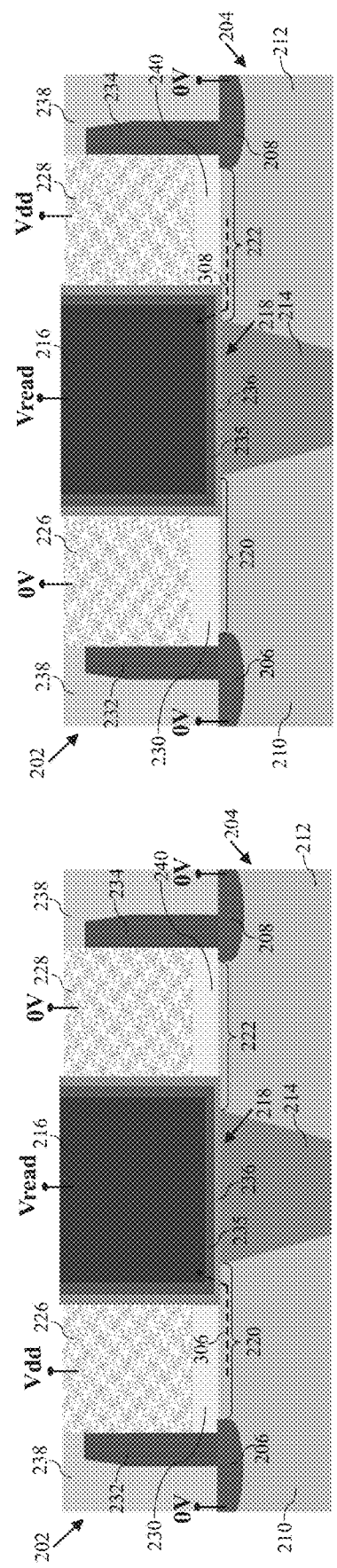

ANTI-FUSE MEMORY CELL AND A METHOD FOR FORMING THE ANTI-FUSE MEMORY CELL

TECHNICAL FIELD

The present disclosure relates generally to anti-fuse memory cells and methods for forming the anti-fuse memory cells.

BACKGROUND

One-time-programmable (OTP) memory cells are non-volatile memory cells that allow data to be written to each cell only once. OTP memory cells are often used in integrated circuits and electronic devices.

There are many different types of OTP memory cells. For example, one type of OTP memory cells utilizes hot electrons injection to program the memory cell. Such a memory cell may include a spacer between two metal gates, and appropriate voltages may be applied to the metal gates to induce the injection of hot electrons into the spacer to program the memory cell. Although such a memory cell is capable of functioning as an OTP memory cell, its performance is often dependent on the profile of the junction between the spacer and the channel through which the electrons travel. Further, tail bits are often present in such memory cells as electrons are often trapped at random locations in the spacer.

Another type of OTP memory cells utilizes anti-fuse technology and may be referred to as anti-fuse memory cells. An anti-fuse memory cell typically includes a thin gate oxide layer under a program gate, and may be programmed by applying appropriate voltages to break down the thin gate oxide layer to form a conductive link between the program gate and a channel region under the thin gate oxide layer. FIGS. 1A and 1B respectively show equivalent circuits of a prior art anti-fuse memory cell 100 before and after programming the memory cell 100. The prior art anti-fuse memory cell 100 includes a program gate 102 electrically coupled to a word line (WL) and a gate oxide layer having a thick portion 104a and a thin portion 104b. Both the thick and thin portions 104a, 104b of the gate oxide layer are arranged on a same substrate under the same program gate 102. The prior art anti-fuse memory cell 100 also includes a bit line (BL) electrically coupled to a conductivity region within the substrate. A channel region is arranged between the conductivity region and the program gate 102 under the gate oxide layer. To program the prior art anti-fuse memory cell 100, a program voltage is applied to the program gate 102 via the WL to break down the thin portion 104b of the gate oxide layer. This forms a conductive link 106 between the program gate 102 and the channel region. To read the memory cell 100, a read voltage is applied to the program gate 102 via the WL to turn on the channel region. If the memory cell 100 is programmed, current will flow through the channel region, and the BL will be pulled towards the read voltage via the channel region and the conductive link 106. If however, the memory cell 100 is not programmed, the memory cell 100 will behave like a switched capacitor, and hence, negligible current will flow through the channel region and the BL voltage will not change substantially. The prior art anti-fuse memory cell 100 can thus be read by detecting the presence of current through the channel region by for example, sensing the BL voltage. In the prior art anti-fuse memory cell 100, the read voltage applied to the program gate 102 during the read operation has to be sufficiently low (e.g. about 0.8V) to prevent a breakdown in the thin portion 104b of the gate oxide layer if the memory cell 100 is not programmed. This causes weak inversion in the channel region (in other words, the channel region is only weakly turned on) especially in the region under the thick portion 104a of the gate oxide layer. In turn, problems such as low current flow through the channel region (and hence low BL voltage) and high current variation over different read operations arise. These problems become more pronounced with the use of advanced technology such as the use of high-k metal gates where the voltage applied to the input/output device of the memory cell is not scaled but the voltage applied to the core device of the memory cell is scaled significantly.

It is therefore desirable to provide an improved memory cell that can overcome the above problems.

SUMMARY

According to various non-limiting embodiments, there may be provided an anti-fuse memory cell including a substrate including a first conductivity region, a second conductivity region, and an isolation region arranged at least partially within the substrate, a program gate arranged over the substrate, a program gate oxide layer arranged over the isolation region and between the program gate and the substrate, a first channel region arranged laterally between the first conductivity region and the isolation region, a second channel region arranged laterally between the second conductivity region and the isolation region, a first select gate arranged over the substrate and over the first channel region and a second select gate arranged over the substrate and over the second channel region. The program gate oxide layer may be configured to break down to allow conduction between the program gate and at least one of the channel regions upon providing a program voltage difference between the program gate and at least one of the channel regions.

According to various non-limiting embodiments, there may be provided a method including providing a substrate; forming a first conductivity region, a second conductivity region, and an isolation region at least partially within the substrate; forming a first select gate and a second select gate over the substrate; forming a program gate oxide layer over the substrate and a program gate over the program gate oxide layer. The program gate oxide layer may be arranged over the isolation region and between the program gate and the substrate. A first channel region may be arranged laterally between the first conductivity region and the isolation region, and a second channel region may be arranged laterally between the second conductivity region and the isolation region. The first select gate may be formed over the first channel region and the second select gate may be formed over the second channel region. The program gate oxide layer may be configured to break down to allow conduction between the program gate and at least one of the channel regions upon providing a program voltage difference between the program gate and at least one of the channel regions.

According to various non-limiting embodiments, there may be provided a memory array including a plurality of anti-fuse memory cells. One or more of the anti-fuse memory cells may include a substrate comprising a first conductivity region, a second conductivity region and an isolation region arranged at least partially within the substrate; a program gate arranged over the substrate; a program gate oxide layer arranged over the isolation region and between the program gate and the substrate; a first channel region arranged laterally between the first conductivity region and the isolation region; a second channel region arranged laterally between the second conductivity region and the isolation region; a first select gate arranged over the substrate and over the first channel region; and a second select gate arranged over the substrate and over the second channel region. The program gate oxide layer may be configured to break down to allow conduction between the program gate and at least one of the channel regions upon providing a program voltage difference between the program gate and at least one of the channel regions.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which:

FIGS. 3A to 3D show cross-sectional views that illustrate the memory cell of FIG. 2C in use according to various embodiments of the present invention.

FIGS. 6A to 6D show cross-sectional views that illustrate a method for fabricating the memory cell of FIG. 2C according to various non-limiting embodiments of the present invention.

DETAILED DESCRIPTION

Figure 1B:
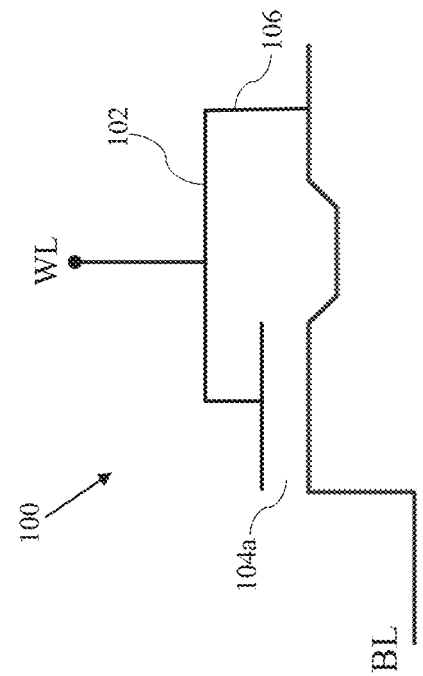
FIG. 1A and FIG. 1B respectively show equivalent circuits of a prior art memory cell before and after programming the prior art memory cell.
Figure 1A:
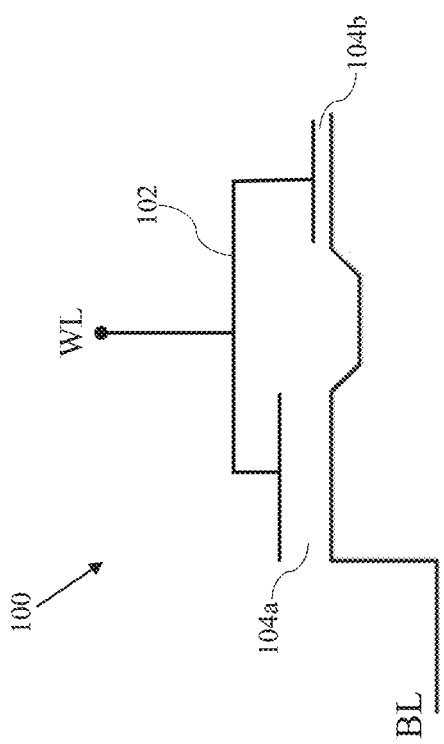

The embodiments generally relate to devices, such as semiconductor devices. More particularly, some embodiments relate to memory cells, for example, one-time-programmable (OTP) memory cells, such as anti-fuse memory cells. The memory cells may be employed in various electronic devices and integrated circuits, such as microprocessors and display drivers.

According to various non-limiting embodiments, an anti-fuse memory cell may include a substrate including a first conductivity region, a second conductivity region, and an isolation region arranged at least partially within the substrate, a program gate arranged over the substrate, a program gate oxide layer arranged over the isolation region and between the program gate and the substrate, a first channel region arranged laterally between the first conductivity region and the isolation region, a second channel region arranged laterally between the second conductivity region and the isolation region, a first select gate arranged over the substrate and over the first channel region and a second select gate arranged over the substrate and over the second channel region. The program gate oxide layer may be configured to break down to allow conduction between the program gate and at least one of the channel regions upon providing a program voltage difference between the program gate and at least one of the channel regions.

According to various non-limiting embodiments, a method may include providing a substrate; forming a first conductivity region, a second conductivity region, and an isolation region at least partially within the substrate; forming a first select gate and a second select gate over the substrate; forming a program gate oxide layer over the substrate and a program gate over the program gate oxide layer. The program gate oxide layer may be arranged over the isolation region and between the program gate and the substrate. A first channel region may be arranged laterally between the first conductivity region and the isolation region, and a second channel region may be arranged laterally between the second conductivity region and the isolation region. The first select gate may be formed over the first channel region and the second select gate may be formed over the second channel region. The program gate oxide layer may be configured to break down to allow conduction between the program gate and at least one of the channel regions upon providing a program voltage difference between the program gate and at least one of the channel regions.

According to various non-limiting embodiments, a memory array may include a plurality of anti-fuse memory cells. One or more of the anti-fuse memory cells may include a substrate comprising a first conductivity region, a second conductivity region and an isolation region arranged at least partially within the substrate; a program gate arranged over the substrate; a program gate oxide layer arranged over the isolation region and between the program gate and the substrate; a first channel region arranged laterally between the first conductivity region and the isolation region; a second channel region arranged laterally between the second conductivity region and the isolation region; a first select gate arranged over the substrate and over the first channel region; and a second select gate arranged over the substrate and over the second channel region. The program gate oxide layer may be configured to break down to allow conduction between the program gate and at least one of the channel regions upon providing a program voltage difference between the program gate and at least one of the channel regions.

According to various non-limiting embodiments, at least one of the select gates may be formed of a first conductive material and the program gate may be formed of a second conductive material, and the first conductive material may be different from the second conductive material.

According to various non-limiting embodiments, the program gate may include a metal gate.

According to various non-limiting embodiments, the first and second select gates may include polysilicon gates.

According to various non-limiting embodiments, the program gate oxide layer may include a high-k material.

According to various non-limiting embodiments, the program gate oxide layer may be further arranged between the program gate and the first select gate, and the program gate oxide layer may be further arranged between the program gate and the second select gate.

According to various non-limiting embodiments, the program gate oxide layer may include a first portion between the first select gate and the isolation region; and a second portion between the second select gate and the isolation region. The first portion and the second portion may be configured to break down independently of one another.

According to various non-limiting embodiments, the first portion may be configured to break down upon providing the program voltage difference between the program gate and the first channel region, and the second portion may be configured to break down upon providing the program voltage difference between the program gate and the second channel region.

According to various non-limiting embodiments, the first channel region may have a uniform conductivity type.

According to various non-limiting embodiments, the second channel region may have a uniform conductivity type.

According to various non-limiting embodiments, the method may further include forming a first conductive layer over the substrate, and forming the first select gate and the second select gate over the substrate may include removing a portion of the first conductive layer to form the first select gate, the second select gate, and a recess between the first select gate and the second select gate.

According to various non-limiting embodiments, forming the program gate oxide layer and the program gate over the substrate may include depositing the program gate oxide layer within the recess; and depositing a second conductive material over the program gate oxide layer to form the program gate.

According to various non-limiting embodiments, the method may further include forming a hard mask over the first conductive layer; forming spacers adjacent to the first conductive layer; forming a dielectric layer over the hard mask and spacers; and removing a portion of the dielectric layer to form a dielectric element adjacent to each of the select gates.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2B:
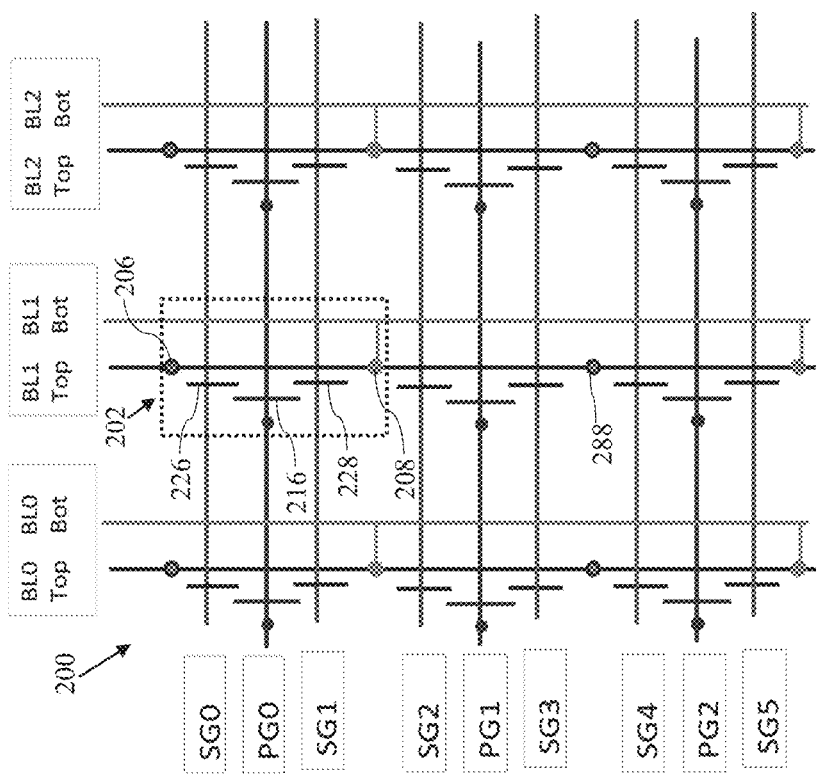
FIG. 2A and FIG. 2B respectively show a top view and an equivalent circuit of a memory array according to various non-limiting embodiments of the present invention.
Figure 2A:
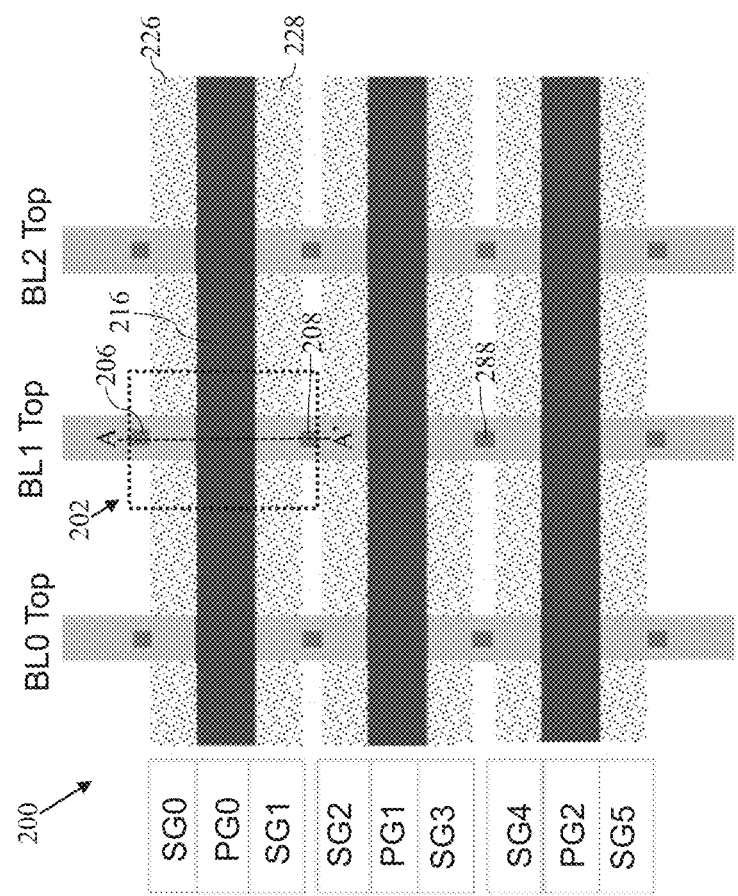

FIG. 2A shows a top view of a memory array 200 according to various non-limiting embodiments. FIG. 2B shows an equivalent circuit of the memory array 200. The memory array 200 may include a plurality of anti-fuse memory cells 202. The memory array 200 may further include a plurality of top bit lines (BL0 Top, BL1 Top, BL2 Top) and bottom bit lines (BL0 Bot, BL1 Bot, BL2 Bot), a plurality of program gates (PG0, PG1, PG2) and a plurality of select gates (SG0, SG1, SG2, SG3, SG4, SG5). As shown in FIGS. 2A and 2B, the memory cells 202 along a same row may share a program gate and two select gates; whereas, the memory cells 202 along a same column may share a top bit line and a bottom bit line. In various non-limiting embodiments, each memory cell 202 may be referred to as a twin bit anti-fuse OTP memory cell.

Figure 2C:
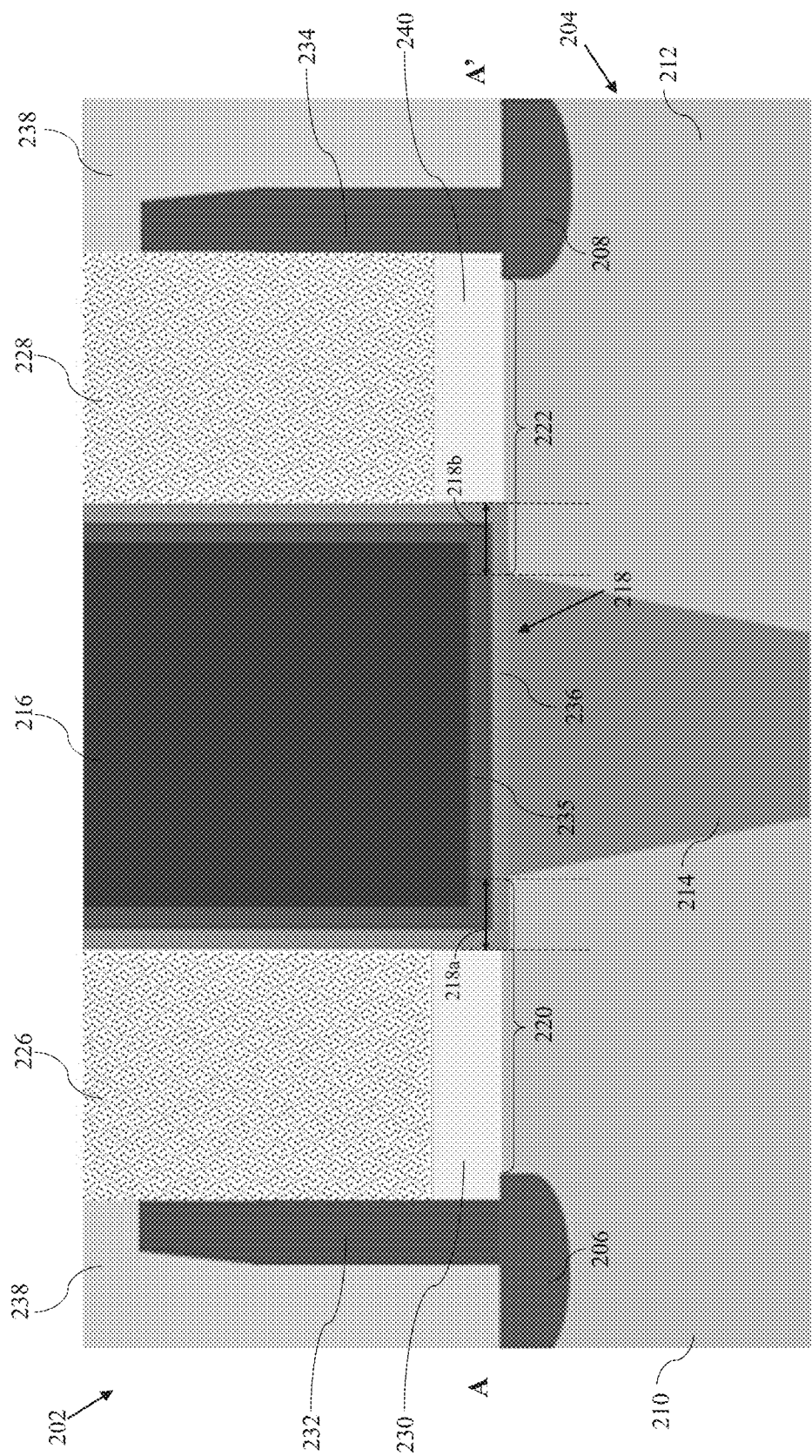
FIG. 2C shows a cross-sectional view of an anti-fuse memory cell of the memory array of FIGS. 2A and 2B.

FIG. 2C shows a cross-sectional view of an anti-fuse memory cell 202 along the line A-A'. The anti-fuse memory cell 202 may include a substrate 204. The substrate 204 may include a first well 210, a second well 212 and an isolation region 214 arranged at least partially within the substrate 204. The isolation region 214 may be arranged between the first well 210 and the second well 212. The substrate 204 may further include a first conductivity region 206 and a second conductivity region 208 arranged at least partially within the substrate 204. For example, the first conductivity region 206 may be arranged at least partially within the first well 210, and the second conductivity region 208 may be arranged at least partially within the second well 212. A first channel region 220 may be arranged laterally between the first conductivity region 206 and the isolation region 214. A second channel region 222 may be arranged laterally between the second conductivity region 208 and the isolation region 214. In various non-limiting embodiments, the first channel region 220 may have a uniform conductivity type, and the second channel region 222 may also have a uniform conductivity type. The first and second conductivity regions 206, 208 may be coupled to respective bit lines (e.g. referring to FIG. 2B, the first conductivity region 206 may be coupled to BL1 Top arranged over the substrate 204 and the second conductivity region 208 may be coupled to BL1 Bot arranged below the substrate 204). Referring to FIGS. 2A and 2B, adjacent memory cells 202 along the same column may share a common conductivity region. For example, as shown in FIGS. 2A and 2B, the memory cell 202 with the program gate PG0 and the memory cell 202 with the program gate PG1 may share the second conductivity region 208. These adjacent memory cells 202 may share a bottom bit line (BL1 Bot) coupled to the common conductivity region 208. These adjacent memory cells 202 may also share a top bit line (BL1 Top). For example, the top bit line (BL1 Top) may be coupled to the first conductivity region 206 of the memory cell 202 with the program gate PG0, and may also be coupled to the other conductivity region 288 of the memory cell 202 with the program gate PG1.

The anti-fuse memory cell 202 may further include a first select gate 226 (e.g. SG0 in FIGS. 2A and 2B) arranged over the substrate 204 and at least partially over the first channel region 220. For example, as shown in FIG. 2C, the first select gate 226 may be arranged partially over the first channel region 220 and partially over the first conductivity region 206. The anti-fuse memory cell 202 may further include a second select gate 228 (e.g. SG1 in FIGS. 2A and 2B) arranged over the substrate 204 and at least partially over the second channel region 222. For example, as shown in FIG. 2C, the second select gate 228 may be arranged partially over the second channel region 222 and partially over the second conductivity region 208. A first select gate oxide layer 230 may be arranged between the first select gate 226 and the substrate 204, and a second select gate oxide layer 240 may be arranged between the second select gate 228 and the substrate 204. The select gate oxide layers 230, 240 under the respective select gates 226, 228 may be similar to oxide layers in input/output (I/O) devices.

Referring to FIG. 2C, the anti-fuse memory cell 202 may further include a program gate 216 (e.g. PG0 in FIGS. 2A and 2B) and a program gate oxide layer 218. The program gate 216 may be arranged over the substrate 204 (e.g. over the isolation region 214 in a non-limiting embodiment). The program gate oxide layer 218 may be arranged at least partially over the isolation region 214 and between the program gate 216 and the substrate 204. The program gate oxide layer 218 may include a first portion 218a between the first select gate 226 and the isolation region 214, and a second portion 218b between the second select gate 228 and the isolation region 214. Referring to FIG. 2C, at least a part of each of the first and second portions 218a, 218b of the program gate oxide layer 218 may be arranged below the program gate 216. The program gate oxide layer 218 may be configured to break down to allow conduction between the program gate 216 and at least one of the channel regions 220/222 upon providing a program voltage difference between the program gate 216 and at least one of the channel regions 220/222. The first portion 218a and the second portion 218b of the program gate oxide layer 218 may be configured to break down independently of one another. Note that the portions 218a, 218b of the program gate oxide layer 218 are not labelled in the remaining figures to avoid cluttering the figures.

As shown in FIG. 2C, the program gate oxide layer 218 may be further arranged between the program gate 216 and the first select gate 226. The program gate oxide layer 218 may also be further arranged between the program gate 216 and the second select gate 228. The program gate oxide layer 218 may include an inner layer 235 in contact with the program gate 216 and an interfacial layer 236. The interfacial layer 236 may be provided between the inner layer 235 and the substrate 204. The interfacial layer 236 may extend to between the inner layer 235 and the first select gate 226, and between the inner layer 235 and the second select gate 228. For example, as shown in FIG. 2C, the interfacial layer 236 may be a U-shaped layer lining a recess between the first and second select gates 226, 228, and the inner layer 235 may be a U-shaped layer along the interfacial layer 236. In a non-limiting embodiment, the inner layer 235 of the program gate oxide layer 218 may be arranged around the program gate 216.

The anti-fuse memory cell 202 may further include a first spacer 232 arranged adjacent to the first select gate 226 and the first select gate oxide layer 230. The first spacer 232 may be arranged over the substrate 204 (e.g. at least partially over the first conductivity region 206). The anti-fuse memory cell 202 may also include a second spacer 234 arranged adjacent to the second select gate 228 and the second select gate oxide layer 240. The second spacer 234 may be arranged over the substrate 204 (e.g. at least partially over the second conductivity region 208). A dielectric element 238 may be provided over the substrate 204 adjacent to each of the select gates 226, 228. For example, as shown in FIG. 2C, each dielectric element 238 may be arranged partially adjacent to the respective spacer 232, 234 and partially adjacent to the respective select gate 226, 228.

Table 1 shows the voltages applied to the memory array 200 when the memory array 200 is in use in various non-limiting embodiments.

TABLE 1

| | Select Gate | | Bit Line | | Program Gate | |
| --- | --- | --- | --- | --- | --- | --- |
| | Selected | Un-selected | Selected | Un-selected | Selected | Un-selected |
| Program | Vdd | Vinh | 0 V | Vinh | Vpgm | Float |
| Read | Vdd | Float | 0 V | Float | Vread | Float |

As shown in Table 1, during a program operation, an on voltage Vdd may be provided to selected select gates, a voltage of 0V may be provided to selected bit lines and a program voltage Vpgm may be provided to selected program gates. On the other hand, an inhibit voltage Vinh may be provided to unselected select gates and to unselected bit lines, and the unselected program gates may be floated. During a read operation, an on voltage Vdd may be provided to selected select gates, a voltage of 0V may be provided to selected bit lines and a read voltage Vread may be provided to selected program gates. On the other hand, the unselected select gates, bit lines and program gates may be floated. Alternatively, during a read operation, a voltage of 0V may be provided to the unselected select gates, bit lines and program gates.

FIGS. 3A-3D show cross-sectional views that illustrate the anti-fuse memory cell 202 in use according to various embodiments of the present invention. For example, FIGS. 3A and 3B show the anti-fuse memory cell 202 during program operations of a first bit and a second bit respectively, and FIGS. 3C and 3D show the anti-fuse memory cell 202 during read operations of the first bit and the second bit respectively.

Figure 4B:
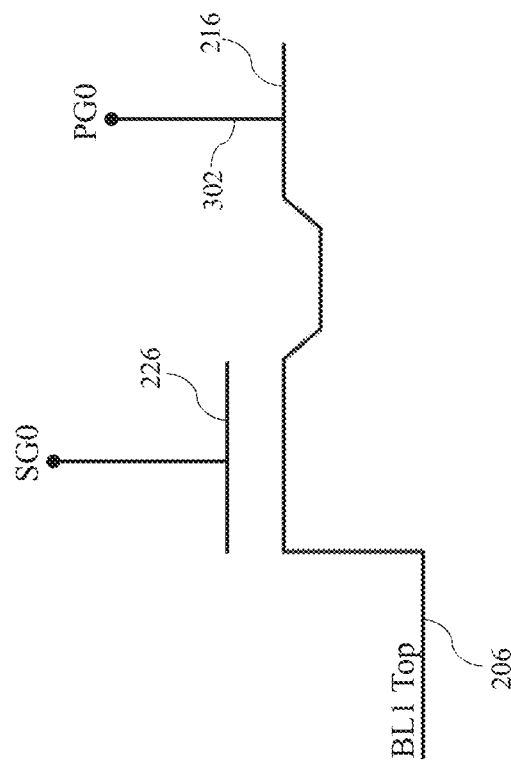
FIGS. 4A and 4B respectively show equivalent circuits of the memory cell of FIG. 2C before and after programming a bit of the memory cell.
Figure 4A:
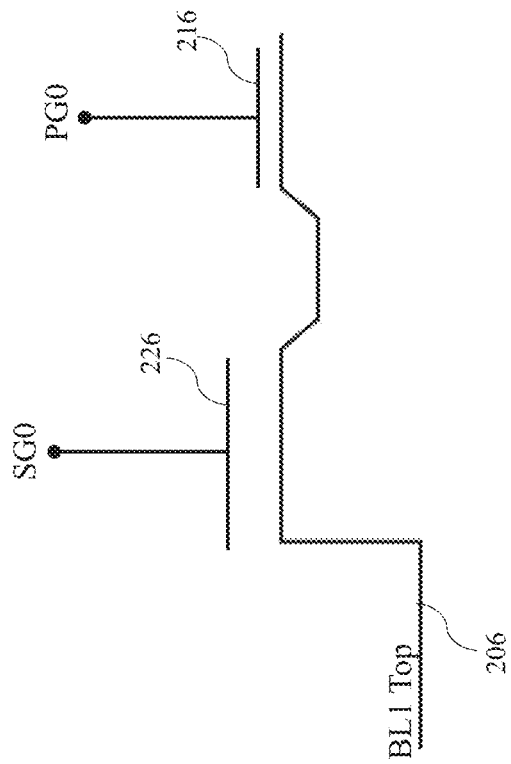

Referring to FIG. 3A, to program the first bit of the anti-fuse memory cell 202, the program gate 216 (e.g. PG0 in FIGS. 2A and 2B), the first select gate 226 (e.g. SG0 in FIGS. 2A and 2B), and the bit line (e.g. BL1 Top in FIGS. 2A and 2B) coupled to the first conductivity region 206 may be selected; whereas, the second select gate 228 (e.g. SG1 in FIGS. 2A and 2B) and the bit line (e.g. BL1 Bot in FIG. 2B) coupled to the second conductivity region 208 may be unselected. In other words, a program voltage Vpgm may be provided to the program gate 216; an on voltage Vdd may be provided to the first select gate 226; an inhibit voltage Vinh may be provided to the second select gate 228 and the second conductivity region 208, and a voltage of 0V may be provided to the first conductivity region 206. Said differently, a program voltage difference may be applied between the program gate 216 and the first channel region 220 and an inhibit voltage difference may be applied between the program gate 216 and the second channel region 222. Upon providing the program voltage difference between the program gate 216 and the first channel region 220, the first portion 218a of the program gate oxide layer 218 may break down to form a conductive link 302 between the program gate 216 and the first channel region 220, to allow conduction between the program gate 216 and the first channel region 220. The magnitude of the program voltage difference may be greater than the magnitude of the inhibit voltage difference. Further, the magnitude of the inhibit voltage difference between the program gate 216 and the second channel region 222 may be sufficiently low such that the second portion 218b of the program gate oxide layer 218 may not break down when the first portion 218a of the program gate oxide layer 218 breaks down. FIG. 4A and FIG. 4B respectively show an equivalent circuit of the first select gate 226 (e.g. SG0), the program gate 216 (e.g. PG0) and the bit line (e.g. BL1 Top) connected to the first conductivity region 206 before and after the formation of the conductive link 302. In various non-limiting embodiments, the first bit of the anti-fuse memory cell 202 may be considered as programmed after formation of the conductive link 302 between the program gate 216 and the first channel region 220.

Referring to FIG. 3B, to program the second bit of the anti-fuse memory cell 202, the program gate 216 (e.g. PG0 in FIGS. 2A and 2B), the second select gate 228 (e.g. SG1 in FIGS. 2A and 2B), and the bit line (e.g. BL1 Bot in FIG. 2B) coupled to the second conductivity region 208 may be selected; whereas, the first select gate 226 (e.g. SG0 in FIGS. 2A and 2B) and the bit line (e.g. BL1 Top in FIGS. 2A and 2B) coupled to the first conductivity region 206 may be unselected. In other words, a program voltage Vpgm may be provided to the program gate 216; an on voltage Vdd may be provided to the second select gate 228; an inhibit voltage Vinh may be provided to the first select gate 226 and the first conductivity region 206, and a voltage of 0V may be provided to the second conductivity region 208. Said differently, a program voltage difference may be applied between the program gate 216 and the second channel region 222, and an inhibit voltage difference may be applied between the program gate 216 and the first channel region 220. Upon providing the program voltage difference between the program gate 216 and the second channel region 222, the second portion 218b of the program gate oxide layer 218 may break down to form a conductive link 304 between the program gate 216 and the second channel region 222, to allow conduction between the program gate 216 and the second channel region 222. Similarly, the magnitude of the program voltage difference may be greater than the magnitude of the inhibit voltage difference. Further, the magnitude of the inhibit voltage difference between the program gate 216, and the first channel region 220 may be sufficiently low such that the first portion 218a of the program gate oxide layer 218 may not break down when the second portion 218b of the program gate oxide layer 218 breaks down. In other words, the first and second portions 218a, 218b may be configured to break down independently of one another. Although not shown in the figures, the equivalent circuits for the second select gate 228, the program gate 216 and the bit line connected to the second conductivity region 208 before and after the formation of the conductive link 304 may be similar to that shown in FIGS. 4A and 4B. In various non-limiting embodiments, the second bit of the anti-fuse memory cell 202 may be considered as programmed after formation of the conductive link 304 between the program gate 216 and the second channel region 222.

Referring to FIG. 3C, to read the first bit of the anti-fuse memory cell 202, the program gate 216 (e.g. PG0 in FIGS. 2A and 2B), the first select gate 226 (e.g. SG0 in FIGS. 2A and 2B) and the bit line (e.g. BL1 Top in FIGS. 2A and 2B) coupled to the first conductivity region 206 may be selected; whereas, the second select gate 228 (e.g. SG1 in FIGS. 2A and 2B) and the bit line (e.g. BL1 Bot in FIG. 2B) coupled to the second conductivity region 208 may be unselected. In other words, a read voltage Vread may be applied to the program gate 216; an on voltage Vdd may be applied to the first select gate 226; and a voltage of 0V may be applied to the second select gate 228, the first conductivity region 206 and the second conductivity region 208. Said differently, a read voltage difference of (Vdd−Vread) may be applied between the program gate 216 and the first select gate 226. Applying the on voltage Vdd to the first select gate 226 may turn on at least a part of the first channel region 220 under the first select gate 226. If the conductive link 302 is present, the read voltage difference of (Vdd−Vread) between the program gate 216 and the first select gate 226 may cause current to flow between the first conductivity region 206 and the program gate 216 (e.g. as indicated by arrow 306 in FIG. 3C). Such current may be referred to as drive current in various non-limiting embodiments. On the other hand, if the conductive link 302 is absent, current may not flow between the first conductivity region 206 and the program gate 216 even with the read voltage difference. Therefore, the first bit may be read as programmed if a current between the first conductivity region 206 and the program gate 216 is detected and may be read as unprogrammed if such a current is not detected.

Referring to FIG. 3D, to read the second bit of the anti-fuse memory cell 202, the program gate 216 (e.g. PG0 in FIGS. 2A and 2B), the second select gate 228 (e.g. SG1 in FIGS. 2A and 2B) and the bit line (e.g. BL1 Bot in FIG. 2B) coupled to the second conductivity region 208 may be selected; whereas, the first select gate 226 (e.g. SG1 in FIGS. 2A and 2B) and the bit line (e.g. BL1 Top in FIGS. 2A and 2B) coupled to the first conductivity region 206 may be unselected. In other words, a read voltage Vread may be applied to the program gate 216; an on voltage Vdd may be applied to the second select gate 228; and a voltage of 0V may be applied to the first select gate 226, the first conductivity region 206 and the second conductivity region 208. Said differently, a read voltage difference of (Vdd−Vread) may be applied between the program gate 216 and the second select gate 228. Applying the on voltage Vdd to the second select gate 228 may turn on at least a part of the second channel region 222 under the second select gate 228. If the conductive link 304 is present, the read voltage difference of (Vdd−Vread) between the program gate 216 and the second select gate 228 may cause current to flow between the second conductivity region 208 and the program gate 216 (e.g. as indicated by arrow 308 in FIG. 3D). Such current may be referred to as drive current in various non-limiting embodiments. On the other hand, if the conductive link 304 is absent, current may not flow between the second conductivity region 208 and the program gate 216 even with the read voltage difference. Therefore, the second bit may be read as programmed if a current between the second conductivity region 208 and the program gate 216 is detected and may be read as unprogrammed if such a current is not detected.

In various non-limiting embodiments, the breakdown of the program gate oxide layer 218 may be confined to the first portion 218a (in other words, the remaining portions of the program gate oxide layer 218 may not break down) when programming the first bit and the breakdown of the program gate oxide layer 218 may be confined to the second portion 218b (in other words, the remaining portions of the program gate oxide layer 218 may not break down) when programming the second bit. Therefore, the first and second portions 218a, 218b of the program gate oxide layer 218 may be referred to as confined breakdown portions. Further, in various non-limiting embodiments, during the read operations of the memory cell 202, the magnitude of the read voltage Vread may be lower than the magnitude of the program voltage Vpgm so as to prevent the first portion 218a or the second portion 218b of the program gate oxide layer 218 from breaking down (if such a breakdown has not occurred). The magnitude of the on voltage Vdd may be higher than the magnitude of the read voltage Vread, so as to strengthen the inversion of the channel region 220/222 to increase the drive current through the channel region 220/222 if the memory cell 202 is programmed. In various non-limiting embodiments, the magnitude of the program voltage Vpgm may range from about 1.1V to about 1.5V, the magnitude of the inhibit voltage Vinh may range from about 0.8V to about 1V, the magnitude of the read voltage Vread may range from about 0.8V to about 1.2V (e.g. the magnitude of the read voltage Vread may be about 0.8V in a non-limiting embodiment), and the magnitude of the on voltage Vdd may range from about 1.5V to about 1.8V (e.g. the magnitude of the on voltage Vdd may be about 1.5V in a non-limiting embodiment). However, other voltage magnitudes may be used in alternative non-limiting embodiments.

Figure 5B:
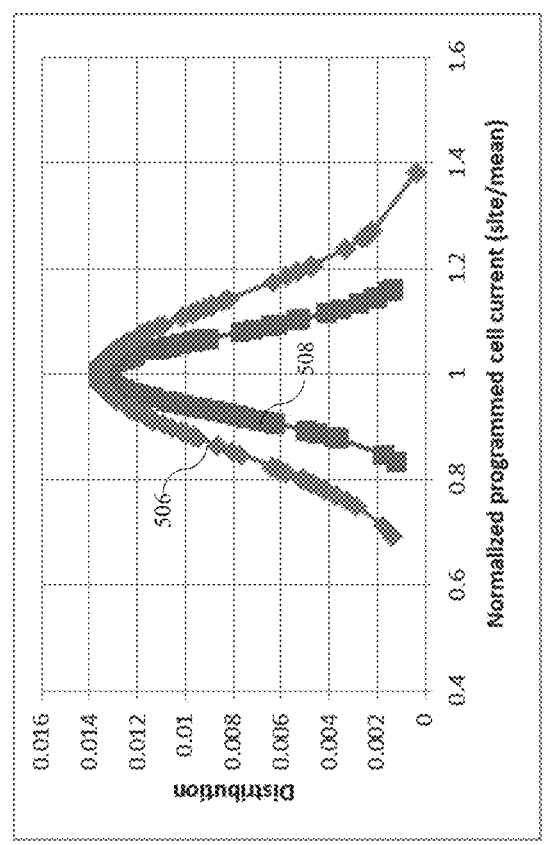
FIGS. 5A and 5B show plots that illustrate current flow through the prior art memory cell of FIGS. 1A and 1B, and current flow through the memory cell of FIG. 2C.
Figure 5A:
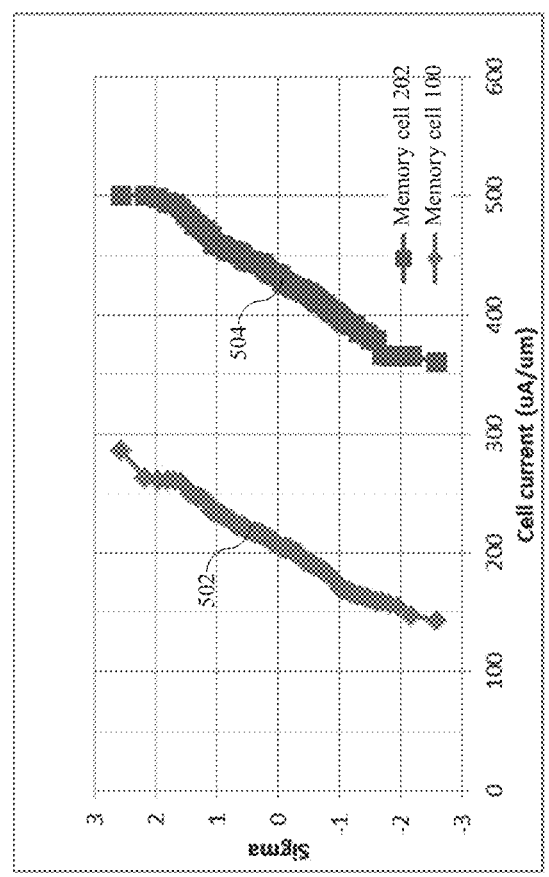

FIGS. 5A and 5B show plots that illustrate current flows through the prior art memory cell 100 and the memory cell 202 simulated via the monte carlo model. In particular, FIG. 5A shows a plot 502 of the cell current through the prior art memory cell 100 when the prior art memory cell 100 is programmed and a plot 504 of the cell current through the anti-fuse memory cell 202 when the first bit and/or the second bit of the anti-fuse memory cell 202 is programmed. The cell current shown by plot 504 corresponds to the current between the program gate 216 and the first or second conductivity region 206/208 when the first bit or the second bit is programmed. FIG. 5B shows a plot 506 of the distribution of the cell current through the prior art memory cell 100 when the prior art memory cell 100 is programmed and a plot 508 of the distribution of the cell current through the memory cell 202 when the memory cell 202 is programmed. As shown in FIG. 5A, the cell current through the programmed memory cell 202 is approximately 108% larger in magnitude than the cell current through the prior art memory cell 100. As shown in FIG. 5B, the standard deviation in the cell current through the programmed memory cell 202 is approximately 47% smaller than the cell current through the programmed prior art memory cell 100.

FIGS. 6A to 6D show cross-sectional views that illustrate a method for fabricating the anti-fuse memory cell 202 according to various non-limiting embodiments of the present invention.

Figures 6A, 6B, 6C, 6D:
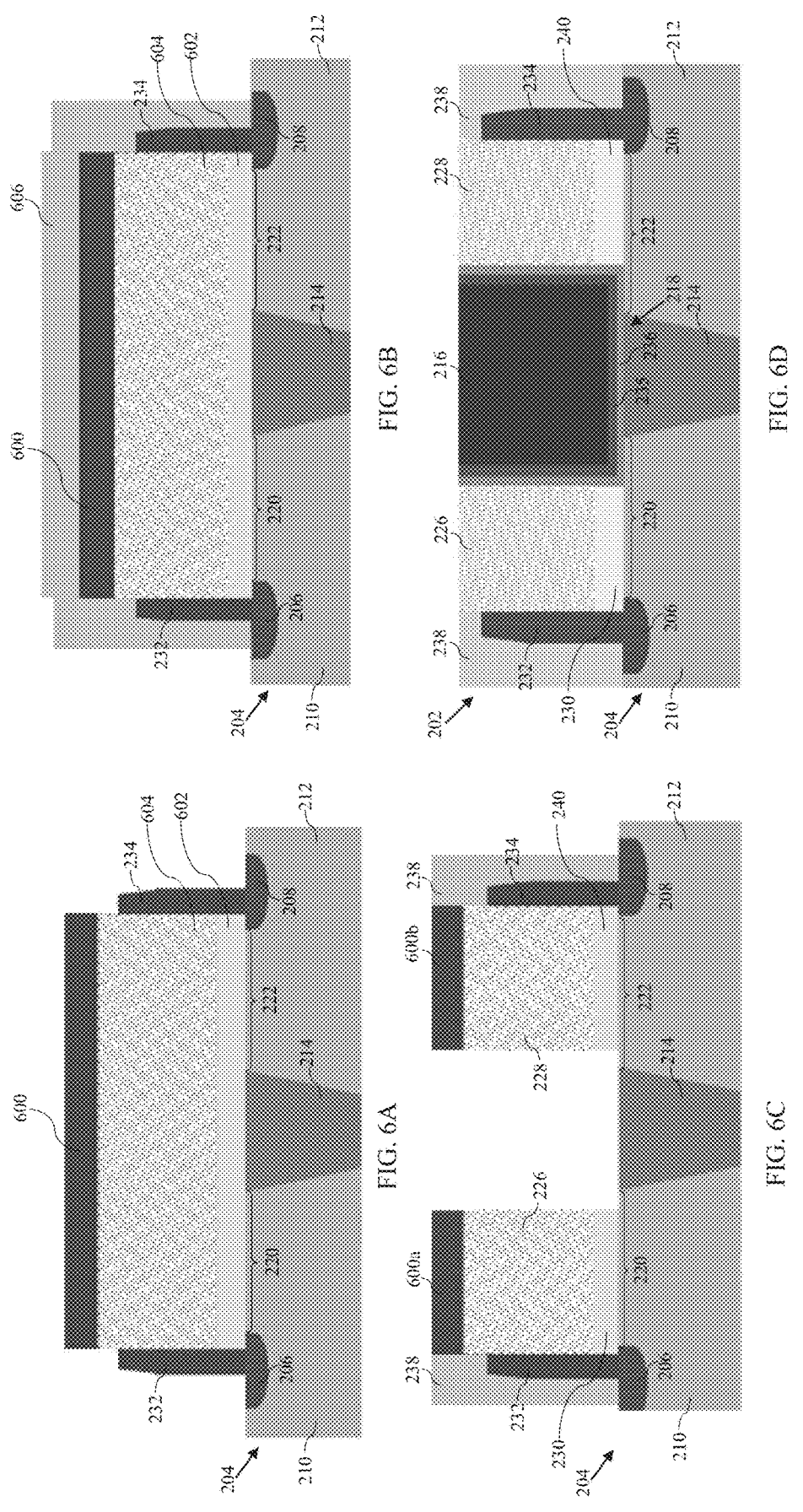

Referring to FIG. 6A, according to various non-limiting embodiments, a method for fabricating the anti-fuse memory cell 202 may begin by providing the substrate 204. In various non-limiting embodiments, the substrate 204 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. Substrate 204 may in addition or instead include various isolations, dopings, and/or device features. The substrate 204 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn), or combinations thereof. Other types of materials as known to those skilled in the art may also be useful for forming the substrate 204.

The method may further include forming the isolation region 214, the first well 210, and the second well 212 at least partially within the substrate 204. The isolation region 214 may be a shallow trench isolation region, and may include an isolation material, such as but not limited to a gap fill oxide or nitride, or a combination of both. In various non-limiting embodiments, the isolation region 214 may be formed by etching the substrate 204 to form an opening and depositing the isolation material into the opening. However, other materials and techniques as known to those skilled in the art may be used to form the isolation region 214. The first well 210 and the second well 212 may include one or more dopants. In one non-limiting embodiment, the first well 210 and second well 212 may have approximately equal doping concentrations (i.e. approximately equal concentrations of dopants). The first well 210 and the second well 212 may be formed by ion implantation or by any other technique as known to those skilled in the art.

In various non-limiting embodiments, at least one of the select gates 226, 228 may be formed of a first conductive material. Referring to FIG. 6A, the method for fabricating the anti-fuse memory cell 202 may include forming a first oxide layer 602 and a first conductive layer 604 (which may include the first conductive material) over the substrate 204. The first conductive layer 604 may be formed over the first oxide layer 602. The first oxide layer 602 and the first conductive layer 604 may be formed using any technique known to those skilled in the art. For example, a first oxide material may be deposited over the substrate 204 and the first conductive material may be deposited over the first oxide material. The first oxide material and the first conductive material may then be etched to form the first oxide layer 602 and the first conductive layer 604. The first oxide material may include any gate oxide material known in the art, such as silicon dioxide in a non-limiting example. The first conductive material may include polysilicon in a non-limiting example (the first conductive layer 604 may be referred to as a dummy poly layer and the first and second select gates 226/228 may include polysilicon gates in this example). However, other materials as known to those skilled in the art may be used.

The method may further include forming the first conductivity region 206 and the second conductivity region 208 at least partially within the substrate 204. This may in turn form the first and second channel regions 220, 222 arranged between the respective conductivity regions 206, 208 and the isolation region 214. Each of the first conductivity region 206 and the second conductivity region 208 may include one or more dopants. In one non-limiting embodiment, the first conductivity region 206 and second conductivity region 208 may have approximately equal doping concentrations (i.e. approximately equal concentrations of dopants). The doping concentrations of the first and second conductivity regions 206, 208 may be higher than the doping concentrations of the first and second wells 210, 212. In a non-limiting embodiment, the doping concentration of the first conductivity region 206 may range from about 1E19 cm-3 to about 1E20 cm-3, the doping concentration of the second conductivity region 208 may range from about 1E19 cm-3 to about 1E20 cm-3, the doping concentration of the first well 210 may range from about 1E16 cm-3 to about 1E18 cm-3 and the doping concentration of the second well 212 may range from about 1E16 cm-3 to about 1E18 cm-3.

The first and second conductivity regions 206, 208 may have a first conductivity type. For example, the first and second conductivity regions 206, 208 may both have a p-type conductivity, in other words, include dopants having a p-type conductivity (e.g. p-type dopants). Alternatively, the first and second conductivity regions 206, 208 may both have an n-type conductivity, in other words, include dopants having an n-type conductivity (e.g. n-type dopants). In a non-limiting embodiment, the first well 210 and the second well 212 may have a second conductivity type different from the first conductivity type. For example, when the first and second conductivity regions 206, 208 have a p-type conductivity, the first well 210 and the second well 212 may have an n-type conductivity. Alternatively, when the first and second conductivity regions 206, 208 have an n-type conductivity, the first well 210 and the second well 212 may have a p-type conductivity. In one example, the implant material for the first and second conductivity regions 206, 208 and the first and second wells 210, 212 may be the same implant material, for example, an epitaxial silicon material in a non-limiting embodiment. The p-type material may be or include, but is not limited to epitaxial silicon germanium and/or the n-type material may be or include, but is not limited to doped silicon material comprising n-type dopants. P-type dopants can for example, include but are not limited to boron (B), aluminium (Al), indium (In) or a combination thereof, while n-type dopants can include carbon (C), phosphorus (P), arsenic (As), antimony (Sb), or a combination thereof. Other types of implant materials and dopants as known to those skilled in the art may also be useful for forming the first and second conductivity regions 206, 208 and first and second wells 210, 212. The first and second conductivity regions 206, 208 may be formed by ion implantation. For example, either p-type dopants (when the conductivity regions 206, 208 have p-type conductivity) or n-type dopants (when the conductivity regions 206, 208 have n-type conductivity) may be implanted into the substrate 204 using the first conductive layer 604 and the first oxide layer 602 as a mask for the implantation. However, other techniques for forming the first and second conductive regions 206, 208 as known to those skilled in the art may also be used.

Referring to FIG. 6A, the method may further include forming a hard mask 600 over the first conductive layer 604. In various non-limiting examples, the hard mask 600 may be formed by depositing a hard mask material over the conductive layer 604 and removing a portion of the hard mask material using techniques such as but not limited to dry etching. Alternatively, the hard mask 600 may be formed by depositing a hard mask material over the first conductive material. The hard mask material, the first conductive material and the first oxide material may be etched at the same time to form the first conductive layer 604, first oxide layer 602 and the hard mask 600 simultaneously. In various non-limiting embodiments, the hard mask material may include silicon nitride or silicon-oxynitride, but other materials as known to those skilled in the art may also be used.

Referring to FIG. 6A, the method may further include forming the spacers 232, 234 adjacent to the first conductive layer 604 and the first oxide layer 602. In various non-limiting embodiments, the spacers 232, 234 may be formed by depositing a spacer material over the substrate 204 and the hard mask 600, and removing a portion of the spacer material using techniques such as but not limited to dry etching where a mask may not be needed. In various non-limiting embodiments, the spacer material may include an insulating material such as, but not limited to, silicon oxide, silicon dioxide, silicon nitride, silicon oxynitride, combinations thereof, or other types of dielectric materials, or multiple layers of insulating materials. However, other materials as known to those skilled in the art may also be used.

Referring to FIG. 6B and FIG. 6C, the method may further include forming the dielectric elements 238 which may be part of an inter-layer dielectric layer in various non-limiting embodiments. The dielectric elements 238 may be formed by forming a dielectric layer 606 over the spacers 232, 234 hard mask 600 and the substrate 204, and removing a portion of the dielectric layer 606 (e.g. a top portion of the dielectric layer 606 above the hard mask 600) by for example, smoothing the top surface of the hard mask 600. The portion of the dielectric layer 606 may be removed by techniques, such as, but not limited to, chemical mechanical polishing (CMP). The dielectric elements 238 may include silicon oxide, silicon dioxide, silicon nitride or combinations thereof, but other materials as known to those skilled in the art may also be used.

Referring to FIG. 6C, the method may include forming the first select gate 226, the second select gate 228, the first select gate oxide layer 230, and the second select gate oxide layer 240 over the substrate 204. In various non-limiting embodiments, the first select gate 226 and the second select gate 228 may be formed by removing a portion of the first conductive layer 604, and the first select gate oxide layer 230 and the second select gate oxide layer 240 may be formed by removing a portion of the first oxide layer 602. A portion of the hard mask 600 may also be removed to form third and fourth mask elements 600a, 600b over the first and second select gates 226, 228 respectively. Removing the portion of the first conductive layer 604, the portion of the first oxide layer 602 and the portion of the hard mask 600 may form a recess between the first select gate 226 and the second select gate 228. As shown in FIG. 6C, the recess may extend from between the third and fourth mask elements 600a, 600b to between the first and second select gate oxide layers 230, 240 in various non-limiting embodiments. In various non-limiting embodiments, the portion of the first conductive layer 604, the portion of the first oxide layer 602 and the portion of the hard mask 600 may be removed simultaneously. For example, a photoresist mask having an opening for the recess may be formed over the hard mask 600 and the dielectric elements 238. The hard mask 600, the first conductive layer 604 and the first oxide layer 602 may then be etched simultaneously using the photoresist mask. However, other techniques as known to those skilled in the art may also be used.

Referring to FIG. 6D, the method may further include forming the program gate oxide layer 218 over the substrate 204. For example, the program gate oxide layer 218 may be deposited within the recess between the first and second select gates 226, 228. In various non-limiting embodiments, forming the program gate oxide layer 218 may include depositing the interfacial layer 236 within the recess between the first and second select gates 226, 228. The interfacial layer 236 may be a U-shaped layer lining the recess. Forming the program gate oxide layer 218 may further include forming the inner layer 235 over the substrate 204. For example, the inner layer 235 may be deposited within the recess between the first and second select gates 226, 228 (e.g. along the interfacial layer 236). The inner layer 235 may also be a U-shaped layer arranged around the program gate 216. The program gate oxide layer 218 may include a high-k material. In a non-limiting example, the inner layer 235 of the program gate oxide layer 218 may include a high-k material; whereas, the interfacial layer 236 of the program gate oxide layer 218 may include silicon dioxide and/or any other material as known to those skilled in the art. By "high-k material", it is meant that the material has a dielectric constant, k, greater than that of silicon dioxide (in other words, greater than 3.9). In various non-limiting embodiments, the inner layer 235 may include a high-k material, such as but not limited to, hafnium oxide, hafnium dioxide, hafnium silicate, zirconium dioxide, zirconium silicate, titanium dioxide, or combinations thereof.

Referring to FIG. 6D, the method may further include forming the program gate 216 over the program gate oxide layer 218. In various non-limiting embodiments, the program gate 216 may be formed of a second conductive material that may be different from the first conductive material. The second conductive material may be deposited over the program gate oxide layer 218 to form the program gate 216. For example, the second conductive material may be deposited over the program gate oxide layer 218 by using the spacers 232, 234, mask elements 600a, 600b and the dielectric elements 238 to protect the select gates 226, 228 and the conductivity regions 206, 208. The program gate 216 may be formed such that a top surface of the program gate 216 is at a level that is the same as a level of the top surfaces of the first and second select gates 226, 228. In various non-limiting embodiments, the mask elements 600a, 600b and a portion of the dielectric elements 238 may then be removed. For example, the top surface of the program gate 216 and the top surfaces of the select gates 226, 228 may be smoothed using techniques such as but not limited to chemical mechanical polishing. In various non-limiting embodiments, the program gate 216 may include a metal gate and the second conductive material may include for example, aluminium, refractory metals, such as, but not limited to, tungsten, titanium, tungsten/titanium nitride layers, other metals such as, but not limited to, tantalum, molybdenum, and alloys of these, or combinations thereof.

The above described order of the steps for the method is only intended to be illustrative, and the steps of the method of the present invention are not limited to the above specifically described order unless otherwise specifically stated.

In various non-limiting embodiments, the memory cell 202 may be fabricated using for example, the method described with reference to FIGS. 6A to 6D, without any additional processes or masks (and hence negligible additional costs) as compared to the fabrication process of prior art memory cells such as the prior art memory cell 100. The method of fabricating the memory cell 202 may include a replacement metal gate (RMG) process and may be easily integrated into advanced high k metal gate (HKMG) processes e.g. 28 nm, 22 nm, 14 nm, 7 nm, 5 nm HKMG processes. By configuring the program gate 216 and the select gates 226, 228 as separate gates, voltages of different magnitudes may be applied to the program gate 216 and the selected select gate 226/228 during a read operation. Thus, an on voltage Vdd of a higher magnitude may be applied to the selected select gate 226/228 to turn on the channel region 220/222, without causing a breakdown in the program gate oxide layer 218 (since a read voltage Vread of a magnitude lower than the program voltage Vpgm may be applied to the program gate 216). An on voltage Vdd of higher magnitude can help strengthen the inversion of the channel regions 220, 222, which may in turn increase the drive current, improve the cell window and improve the current distribution (allowing a smaller standard deviation in the current) through the memory cell 202 when the memory cell 202 is programmed. Further, in the memory cell 202, the breakdown of the program oxide layer 218 may be confined to specific confined breakdown portions e.g. portions 218a, 218b and thus, the current distribution of the memory cell 202 may be improved. Further, the presence of the isolation region 214 may separate the confined breakdown portions 218a and 218b such that they can break down independently of each other. The program gate 216 may hence be shared by two select gates 226, 228. Therefore, each memory cell 202 may allow programming of two bits (instead of one bit). In turn, the size of the memory array 200 may be reduced and a more compact memory array 200 may be achieved. In a non-limiting embodiment, the size of the memory array 200 may be about 28% smaller than the size of a prior art memory array, such as a memory array including prior art memory cells 100.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:
1. An anti-fuse memory cell comprising:
 a substrate comprising a first conductivity region, a second conductivity region, and an isolation region arranged at least partially within the substrate;
 a program gate arranged over the substrate;
 a program gate oxide layer arranged over the isolation region and between the program gate and the substrate;
 a first channel region having a uniform conductivity type extending entirely and laterally along a top surface of the substrate between the first conductivity region and the isolation region;
 a second channel region having a uniform conductivity type extending entirely and laterally along the top surface of the substrate between the second conductivity region and the isolation region;
 a first select gate arranged over the substrate and over the first channel region; and
 a second select gate arranged over the substrate and over the second channel region;

wherein the program gate oxide layer comprises a first portion arranged over the first channel region and a second portion arranged over the second channel region.

2. The anti-fuse memory cell according to claim 1, wherein at least one of the select gates is formed of a first conductive material and the program gate is formed of a second conductive material, and wherein the first conductive material is different from the second conductive material.

3. The anti-fuse memory cell according to claim 1, wherein the program gate comprises a metal gate.

4. The anti-fuse memory cell according to claim 1, wherein the first and second select gates comprise polysilicon gates.

5. The anti-fuse memory cell according to claim 1, wherein the program gate oxide layer comprises a high-k material.

6. The anti-fuse memory cell according to claim 1, wherein the program gate oxide layer is further arranged laterally between the program gate and the first select gate, and wherein the program gate oxide layer is further arranged laterally between the program gate and the second select gate.

7. The anti-fuse memory cell according to claim 1,
wherein the first portion of the program gate oxide layer is arranged laterally between the first select gate and the isolation region; and the second portion of the program gate oxide layer is arranged laterally between the second select gate and the isolation region;
wherein the first portion and the second portion are configured to break down independently of one another.

8. The anti-fuse memory cell according to claim 7, wherein the first portion is configured to break down upon providing a program voltage difference between the program gate and the first channel region, and wherein the second portion is configured to break down upon providing a program voltage difference between the program gate and the second channel region.

9. The anti-fuse memory cell according to claim 1, wherein the isolation region is arranged laterally between the first channel region and the second channel region.

10. The anti-fuse memory cell according to claim 1, wherein the program gate is arranged partially over the isolation region.

11. The anti-fuse memory cell according to claim 1, wherein at least a part of the first portion of the program gate oxide layer is arranged below the program gate, and at least a part of the second portion of the program gate oxide layer is arranged below the program gate.

12. The anti-fuse memory cell according to claim 1, wherein the program gate oxide layer comprises:
an inner layer in contact with the program gate; and
an interfacial layer between the inner layer and the substrate.

13. The anti-fuse memory cell according to claim 1, wherein the program gate oxide layer is arranged to line a bottom surface and side surfaces of a recess between the first select gate and the second select gate.

14. The anti-fuse memory cell according to claim 1, wherein the first select gate is arranged partially over the first channel region and partially over the first conductivity region, and wherein the second select gate is arranged partially over the second channel region and partially over the second conductivity region.

15. The anti-fuse memory cell according to claim 1, further comprising a first select gate oxide layer arranged between the first select gate and the substrate, and a second select gate oxide layer arranged between the second select gate and the substrate.

16. The anti-fuse memory cell according to claim 1, further comprising a first spacer arranged adjacent to the first select gate and at least partially over the first conductivity region, and a second spacer arranged adjacent to the second select gate and at least partially over the second conductivity region.

17. The anti-fuse memory cell according to claim 9, wherein the isolation region extends between the top surface of the substrate and a bottom surface of the substrate.

18. The anti-fuse memory cell according to claim 6, wherein the program gate oxide layer abuts the first select gate and the second select gate.

19. The anti-fuse memory cell according to claim 15, wherein the first portion of the program gate oxide layer abuts the first select gate oxide layer and the second portion of the program gate oxide layer abuts the second select gate oxide layer.

20. A memory array comprising a plurality of anti-fuse memory cells, wherein each anti-fuse memory cell comprises:
a substrate comprising a first conductivity region, a second conductivity region, and an isolation region arranged at least partially within the substrate;
a program gate arranged over the substrate;
a program gate oxide layer arranged over the isolation region and between the program gate and the substrate;
a first channel region having a uniform conductivity type extending entirely and laterally along a top surface of the substrate between the first conductivity region and the isolation region;
a second channel region having a uniform conductivity type extending entirely and laterally along the top surface of the substrate between the second conductivity region and the isolation region;
a first select gate arranged over the substrate and over the first channel region; and
a second select gate arranged over the substrate and over the second channel region;
wherein the program gate oxide layer comprises a first portion arranged over the first channel region and a second portion arranged over the second channel region.

* * * * *